(12) United States Patent
Garza et al.

(10) Patent No.: US 7,001,856 B2
(45) Date of Patent: Feb. 21, 2006

(54) METHOD OF CALCULATING A PRESSURE COMPENSATION RECIPE FOR A SEMICONDUCTOR WAFER IMPLANTER

(75) Inventors: Frederico Garza, Richmond, VA (US); Karl Peterson, Mechanicsville, VA (US); Michael Wright, Richmond, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 67 days.

(21) Appl. No.: 10/697,639

(22) Filed: Oct. 31, 2003

(65) Prior Publication Data
US 2005/0095800 A1 May 5, 2005

(51) Int. Cl.
*H01L 21/00* (2006.01)

(52) U.S. Cl. .................. 438/800; 438/373; 438/374; 438/514

(58) Field of Classification Search ........... 438/800, 438/373–376, 514–519, 527
See application file for complete search history.

(56) References Cited

U.S. PATENT DOCUMENTS

2003/0116089 A1 * 6/2003 Walther .................. 118/723 E

\* cited by examiner

*Primary Examiner*—Dung A. Le
(74) *Attorney, Agent, or Firm*—Staas & Halsey LLP (57) ABSTRACT

A process uses pressure changes and a pressure compensation factor to estimate the rate at which neutral atoms are implanted. While implanting a first wafer using a first pressure compensation factor, the rate at which ions are implanted is determined. The first wafer is moved radially with respect to an ion beam while implanting ions into the first wafer so as to achieve a uniform total dose based on the rate at which ions are implanted and the estimated rate at which neutral atoms are implanted. The pressure is determined while implanting the first wafer, determining the pressure. A second pressure compensation factor is selected, that would have achieved a uniform rate of implanted ions plus implanted neutral atoms across a surface of the first wafer. The second pressure compensation factor is different from the first pressure compensation factor. The second pressure compensation factor is used to implant a second wafer. The second wafer is tested by forming a sheet resistance contour map. If the sheet resistant contour map shows uniform resistance across the wafer, the second pressure compensation factor is used to implant wafers subsequent to the second wafer.

9 Claims, 8 Drawing Sheets

METHOD OF CALCULATING A PRESSURE COMPENSATION RECIPE FOR A SEMICONDUCTOR WAFER IMPLANTER

BACKGROUND OF THE INVENTION

Impurities are implanted into semiconductor devices for a variety of reasons, including introducing electrons and holes into the semiconductor substrate in order to locally change the conductive properties of the substrate. For example, silicon has four electrons in the outer ring. Phosphorus has five electrons in its outer ring, one more than silicon. Boron has three electrons in its outer ring, one fewer electron than silicon. Boron can be used to introduce holes into the substrate. Phosphorous can be used to introduce electrons into the substrate.

To enable implantation, the impurities are implanted as ions having one fewer electron than the neutral species. During the implantation process, the electron deficit can be used to determine how much impurity has been implanted. Specifically, it is not possible to accurately count the number of ions (or atoms) leaving the ion gun. Therefore, a predetermined portion of the ions is directed to an ion counter instead of the semiconductor wafer(s). The ion counter may be embodied has a disk faraday. When an ion strikes the disk faraday, an electron is pulled to the disk faraday in order to neutralize the ion. The number of electrons pulled to the disk faraday is counted using a current meter. It is presumed that the number of ions striking in the disk faraday is proportional to the number of ions striking and entering the semiconductor wafer.

The current (electrons per second) represents the rate at which impurities are introduced into the wafer. If the implanter detects that one area of the wafer is receiving impurities at a slower rate than other areas of the wafer, then the implanter spends more time implanting on the deficient area. In this manner, the implanter can work to achieve uniform total dosing across the surface of the wafer.

When the ions hit the semiconductor wafer, they may destroy a portion of a resist layer formed on the wafer. This process releases an outgas into the implant chamber, which would otherwise kept at a very low pressure. Electrons from the outgas can neutralize a portion of the ions, before the ions reach the disk faraday or the semiconductor wafer. Although the ions are neutralized by the resist outgas (rather than being neutralized at the disk faraday or within the semiconductor wafer), the neutral species is still implanted and still causes the desired change to the substrate. However, because the neutral species contains the correct number of electrons, there is not disk faraday current flow for neutralization. Therefore, the neutral species are not counted.

In order to count the impurities implanted as atoms, rather than ions, a pressure sensor is used. As the pressure increases from resist outgassing, it is presumed that a larger percentage of the impurities are introduced into the wafer as atoms rather than ions.

The following equation represents how pressure is taken into consideration to determine the number of ions implanted.

$$I_{DISK} = I_{DOSE} \cdot e^{-KP}$$

In the above equation, $I_{DISK}$ is the current flowing to the disk faraday. This current is proportional to the number of ions implanted. $I_{DISK}$ is the rate at which impurities (ions+atoms) are implanted. P is the pressure as sensed by the ion gauge/pressure sensor within the device. K is a factor determined by the engineer and input into the implanter. K represents how a pressure change is presumed to effect ion neutralization.

Instead of, or in addition to, the K-factor shown above, a pressure compensation factor P-COMP can be used. The mathematical relationship between K and P-COMP is as follows:

$$P - COMP = 100(e^{K/10000} - 1)$$

or $$K = \ln\left(1 + \frac{P - COMP}{100}\right)(10000)$$

Because K and P-COMP are interchangeable through simple math, the term "pressure compensation factor" is used hereinafter to represent both K and P-COMP with the understanding that the two parameters are interchangeable through the above mathematical relationships.

Conventional methods for determining the pressure compensation factor K (or P-COMP) have several disadvantages. 1) Wafers must be implanted, annealed, and measured. This takes time, incurs implanter downtime, and costs money in test wafers. 2) The conventional method uses wafer mean sheet resistance values to determine the pressure compensation factor. K (or P-COMP) does not take wafer non-uniformity into account. Using mean sheet resistance is especially disadvantageous since the purpose of the procedure is to minimize wafer non-uniformity. 3) The conventional method requires patterned resist dummy wafers and one bare silicon test wafers. This consumes photolithography tool time. 4) The conventional method does not test whether the pressure compensation factor is optimum for actual product wafer runs. This prevents the process engineer from easily verifying dose (number of ions plus number of atoms) uniformity without the use of parametric device data, which is a time-consuming effort and is not done for implanter monitoring.

SUMMARY OF THE INVENTION

To possibly address these and/or other concerns, the inventors propose a process that uses pressure changes and a pressure compensation factor to estimate the rate at which neutral atoms are implanted. While implanting a first wafer using a first pressure compensation factor, the rate at which ions are implanted is determined. The first wafer is moved radially with respect to an ion beam while implanting ions into the first wafer so as to achieve a uniform total dose based on the rate at which ions are implanted and the estimated rate at which neutral atoms are implanted. The pressure is determined while implanting the first wafer, determining the pressure. A second pressure compensation factor is selected, that would have achieved a uniform rate of implanted ions plus implanted neutral atoms across a surface of the first wafer. The second pressure compensation factor is different from the first pressure compensation factor. The second pressure compensation factor is used to implant a second wafer. The second wafer is tested by forming a sheet resistance contour map. If the sheet resistant contour map shows uniform resistance across the wafer, the second pressure compensation factor is used to implant wafers subsequent to the second wafer.

An Axcelis GSD™ platform implanter may be used to implant ions in the first and second wafers. The following equation may be used to estimate the rate at which neutral ions are implanted:

$$I_{MEASURED} = I_{DOSE} \cdot e^{-kp}$$

where $I_{MEASURED}$ is the rate at which ions are implanted, $I_{DOSE}$ is the sum of the rate at which ions are implanted and the estimated rate at which neutral atoms are implanted, K is a pressure compensation factor and P is the pressure. A parameter P-COMP relates to the pressure compensation factor K according to the following equation:

$$K = \ln\left(1 + \frac{P - COMP}{100}\right)(10000).$$

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Under resist outgassing conditions, the beam current drops due to recombination. Recombination is when an ion is combined with an electron and becomes a neutral atom. The neutral atom is still implanted into the wafer but not counted by the disk faraday of the implanter. Therefore, for every neutralized ion at a specific wafer area, the implanter focuses the beam on the wafer for an additional time long enough to implant one additional ion. This causes an overdose of one ion. The amount of resist exposed to the beam is greatest at the vertical center of the wafer. If pressure compensation is not used, the vertical center of the wafer is overdosed relative to the top and bottom areas of the wafer.

Figure 1:
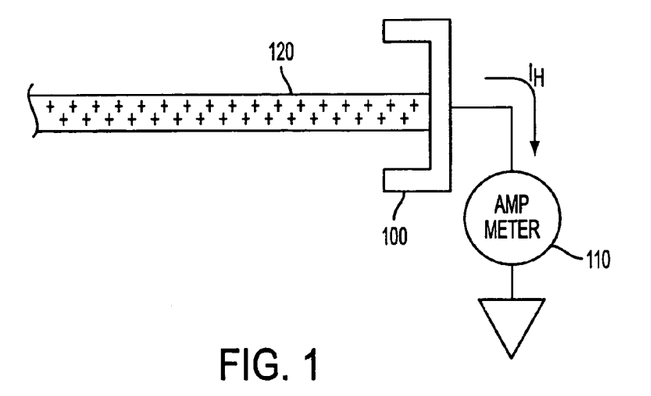
FIG. 1 is a schematic side view of a disk faraday used to determine beam current, which is in turn used to count the number of implanted ions.
Figure 2A:
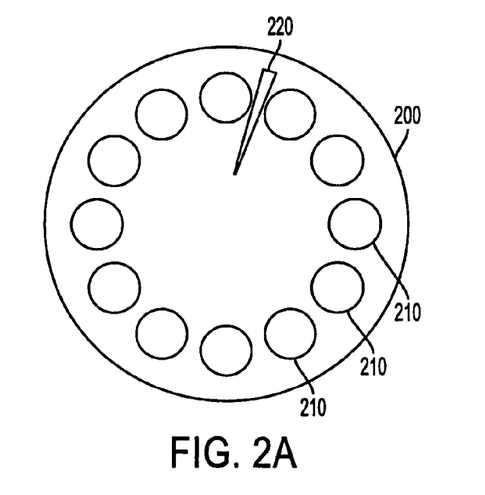
FIG. 2A is a top view of a disk holding a plurality of wafers for implantation.

FIG. 1 is a schematic side view of a disk faraday used to determine beam current, which is in turn used to count the number of implanted ions. FIG. 2A is a top view of a disk holding a plurality of wafers for implantation. In FIG. 2A, a plurality of wafers 210 are arranged on the disk 200. A disk slot 220 is positioned among the wafers 210. An ion gun focuses a beam spot at one point on the wafers 210 as the disk 200 rotates.

Figure 2B:
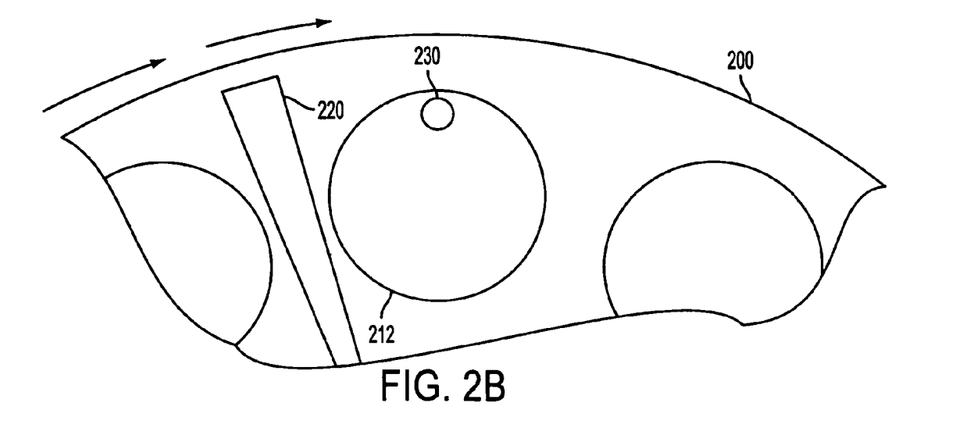
FIG. 2B is an enlarged top view of the disk shown in FIG. 2A.

FIG. 2B is an enlarged top view of the disk shown in FIG. 2A. In FIG. 2B, reference numeral 230 represents a beam spot, where the beam is currently being focused. If the disk 200 is being rotated in a clockwise direction with the beam spot 230 focused as shown, the beam spot 230 will move from wafer to wafer, implanting impurities toward the top of each wafer 210. According to one embodiment, the disk rotates at approximately 1200 rpm. As the disk rotates, a portion of the beam will extend through the disk via the disk slot 220. At this point, the beam spot 230 is directed through the disk 200 to the disk faraday 100 shown in FIG. 1. The beam 120 contains ions. The disk faraday 100 is grounded. Electrons flow into the disk faraday 100 through a current meter 110 to thereby neutralize each of the ions. The current meter 110 counts the number of electrons, producing a current reading.

Figure 3:
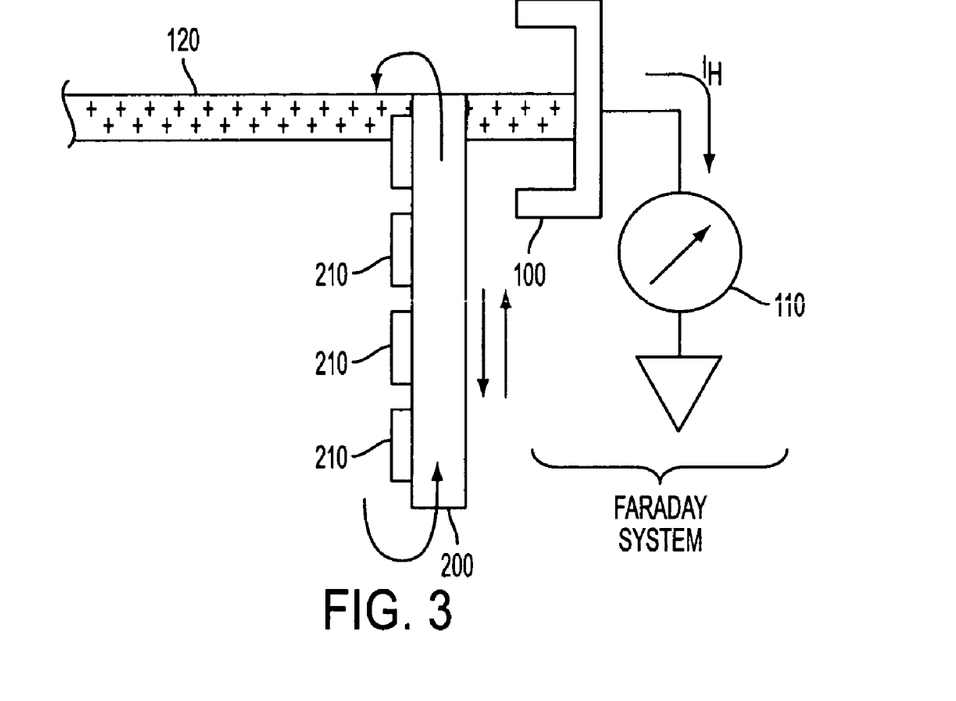
FIG. 3 is a side view of the disk faraday shown in FIG. 1 and the disk shown in FIGS. 2A and 2B.

FIG. 3 is a side view of the disk faraday 100 shown in FIG. 1 and the disk 200 shown in FIGS. 2A and 2B. The disk 200 moves vertically up and down with respect to a horizontally traveling beam 120. This ensures that the beam 120 strikes the complete area of each wafer 210 mounted on the disk. Referring to FIG. 2B, the vertical travel path of the beam is such that the beam travels slightly past the top of the wafer 212 (where it is shown in FIG. 2B). When the beam is slightly above wafer 212, the beam changes direction to travel toward the bottom of the wafer 212. After traveling slightly paste the bottom of the wafer 212, the beam again changes direction so as to head toward the top of the wafer 212. The beam therefore stops and changes directions when the beam is not on the wafer.

The amount of outgassing is proportional to the amount of time that the beam is on the resist, which can be translated to the time the beam spends on the wafer. The beam spends time on the wafer, on the disk slot and the on the disk between, above and below the wafers.

Figure 4:
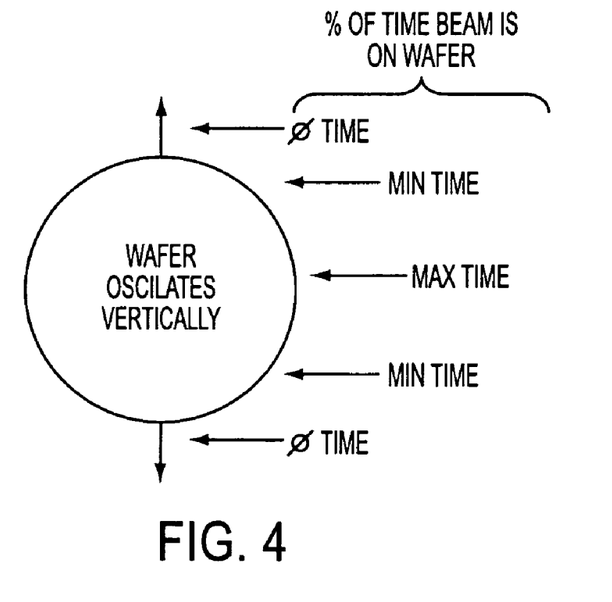
FIG. 4 is a schematic representation of the time spent on the wafer during the beam travel path.

FIG. 4 is a schematic representation of the time spent on the wafers during the beam travel path. When the beam is above or below the wafer, there is no time spent on the wafers. All of the time during the disk rotation is spent on the disk or possibly on the disk slot. When the beam is at the top and bottom of the wafer, there is a minimum time spent on the wafer. During each revolution of the disk 200, the beam 220 spends most of its time on the disk 200, rather than on a wafer 210. At the middle of the wafer, the beam spends the maximum time on the wafer.

Figure 5:
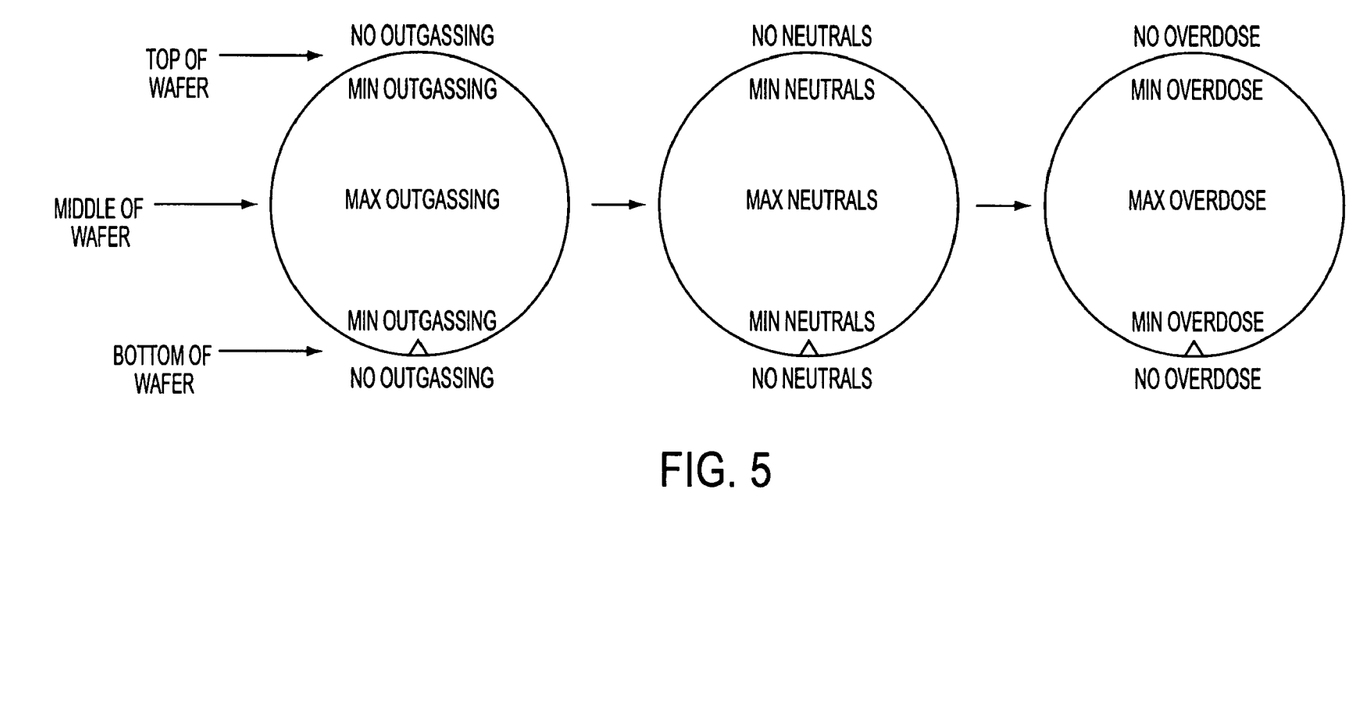
FIG. 5 shows the correlation between the time the beam spends on the wafer at various disk positions, the amount of outgassing, the number of neutral species implanted and the amount of overdose if the neutral species are ignored in the calculations.

FIG. 5 shows the correlation between the time the beam spends on the wafer at various disk positions (FIG. 4), the amount of outgassing, the number of neutral species implanted and the amount of overdose if the neutral species are ignored in the calculations. When the beam is at the center of the wafer, there is more outgassing and beam neutralization. The current meter 110 detects fewer implanted ions. Without accounting for the neutralized atoms, the disk moves more slowly when the beam is focused at the center of the wafer. This allows the beam to implant more ions on the center of the wafer. Because the implanted neutralized atoms are ignored, this results an overdose in the center of the wafer.

Figure 6:
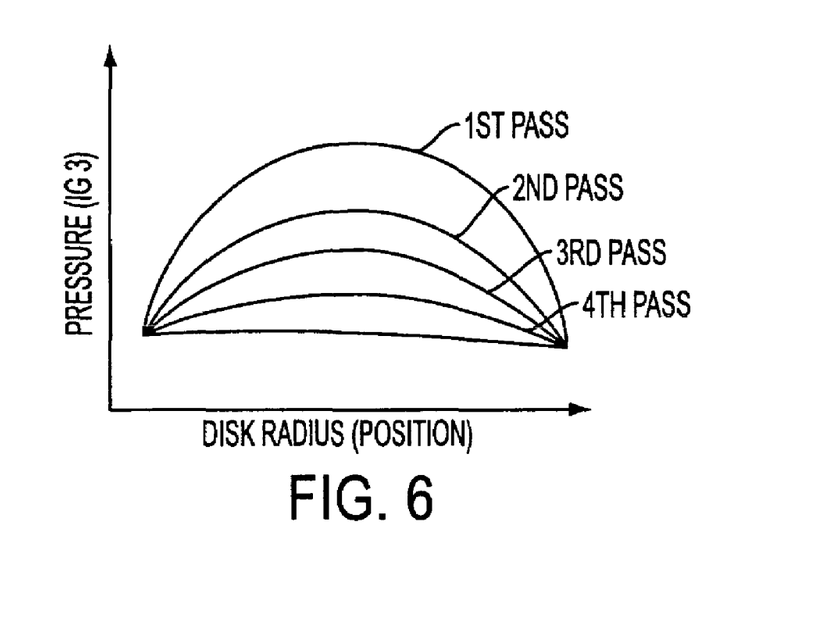
FIG. 6 is a plot of mean sheet resistance versus P-COMP values for a conventional method of determining a P-COMP value.
Figure 7:
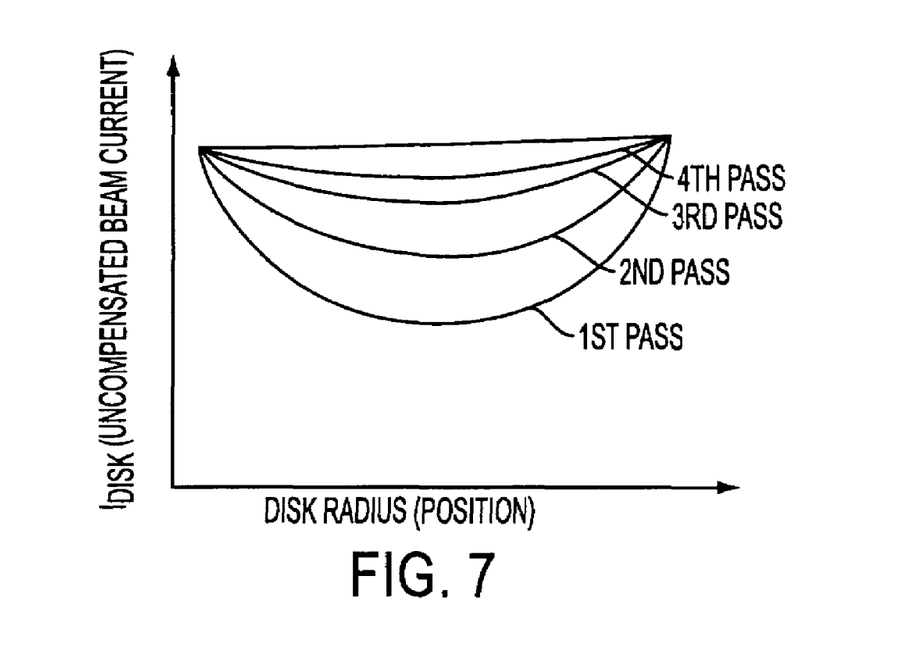
FIG. 7 shows an X-Y plot of the uncompensated beam current $I_{DISK}$ as a function of disk radius.

At the beginning of the implantation process, there is more resist to be burnt. There is therefore more resist outgassing at the beginning of the implantation process than at the end of the implantation process. Pressure is proportional to the amount of outgassing. FIG. 6 is an X-Y plot of outgassing as a function of disk radius. As can be seen, the largest pressure increase happens on the first pass of the ion beam over the wafer. There is less of a pressure increase with each succeeding pass. For each pass, the pressure increase is greatest at the center of the wafer. It should be noted that the beam may be traveling in opposite directions for each succeeding pass. For example, the first pass may be a downward pass, the second pass may be an upward pass, the third pass may be a downward pass, and so on. The outgassing is reduced with the each pass due to the decreasing availability of hydrogen and resist solvents in the organic resist. This is known as resist conditioning. FIG. 7 shows an X-Y plot of the uncompensated beam current $I_{DISK}$ as a function of disk radius. FIG. 7 represents the current detected by the disk faraway. Comparing FIGS. 6 and 7, it can be seen that when there is maximum outgassing, the disk faraday detects the minimum current. This is because the outgassing causes the ions to recombine before implantation.

The dose system controls the vertical disk speed. It attempts to minimize vertical dose non-uniformity by changing the vertical disk speed in response to changes in the measured beam current $I_{DISK}$. A drop in measured beam current causes the vertical disk speed to decrease at that vertical position so that an underdosing situation does not occur. The vertical disk speed may be varied while maintaining the same disk rotational speed. If the beam current drop is "legitimate" meaning it is caused by something that effects the number of implanted impurities (ions plus atoms), then dose uniformity is optimized by the vertical speed reduction. If the beam current drops due to beam neutralization, then overdosing occurs at the vertical position on the wafer that is being hit by the beam when the speed reduction occurs. Pressure changes are considered in order to differentiate between legitimate current drops and neutralization current drops. With the following equation, $I_{DISK}$ to control vertical disk speed:

$$I_{DISK}=I_{DOSE} \cdot e^{-KP}$$

For one revolution of the disk, the relative area struck by the beam spot is related to the circumference. That is, the closer the beam is to the center of the disk (not center of the wafer), the less area (wafers plus exposed disk) that is covered by the beam spot during each revolution. As the beam spot gets further towards the outer periphery of the disk, more area (wafers plus exposed disk) is covered during each revolution.

Since the area changes for a given disk position and the disk rotational speed does not change, the horizontal speed of the beam over the outer areas disk is greater. Toward the outer portions of the disk, fewer impurities are implanted per area for each rotation. To compensate for this and to ensure dose uniformity, the vertical speed of the disk changes.

Figure 8A:
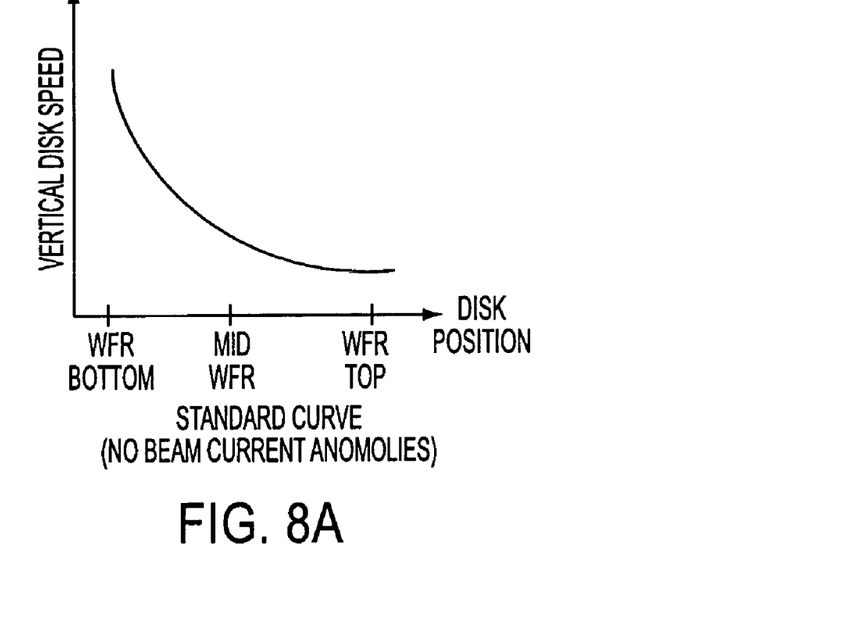
FIG. 8A is a plot of vertical disk speed versus disk position.

FIG. 8A is a plot of vertical disk speed versus disk position. The vertical speed is slowest towards the top of the wafer, where the horizontal disk speed is greatest. A slower vertical disk speed effectively allows the beam to implant on a given area for more revolutions the disk.

Figure 8B:
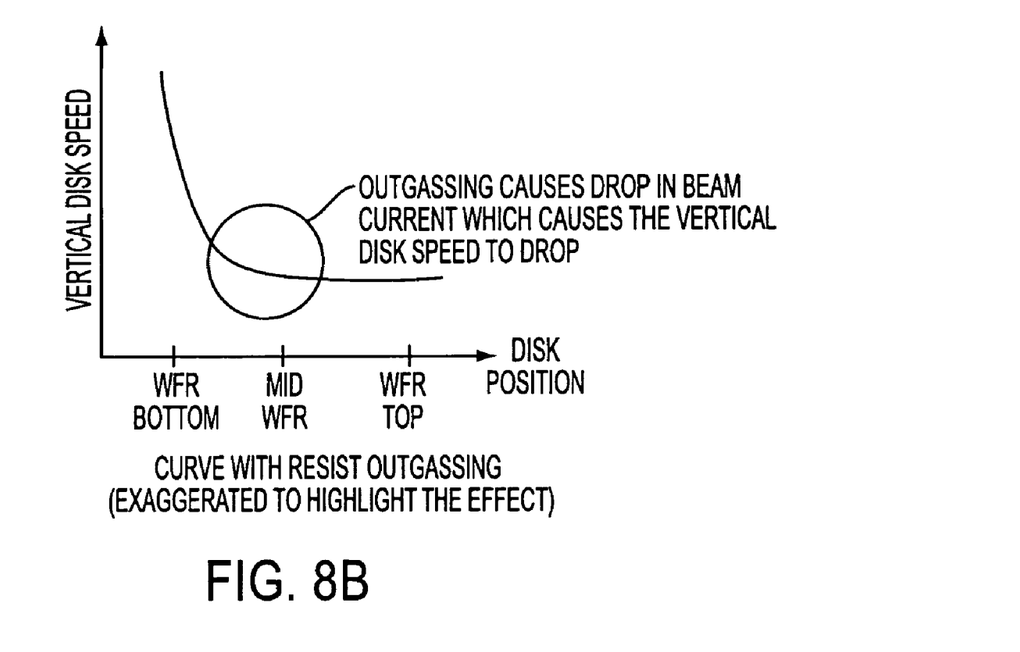
FIG. 8B is a plot of vertical disk speed versus disk position when outgassing causes a drop in beam current.

FIG. 8B is a plot of vertical disk speed versus disk position when outgassing causes a drop in beam current. The flat portion of the curve shown in FIG. 8B demonstrates that when there is outgassing toward the middle of the wafer, the vertical disk speed is slower than would otherwise be necessary.

Figure 9:
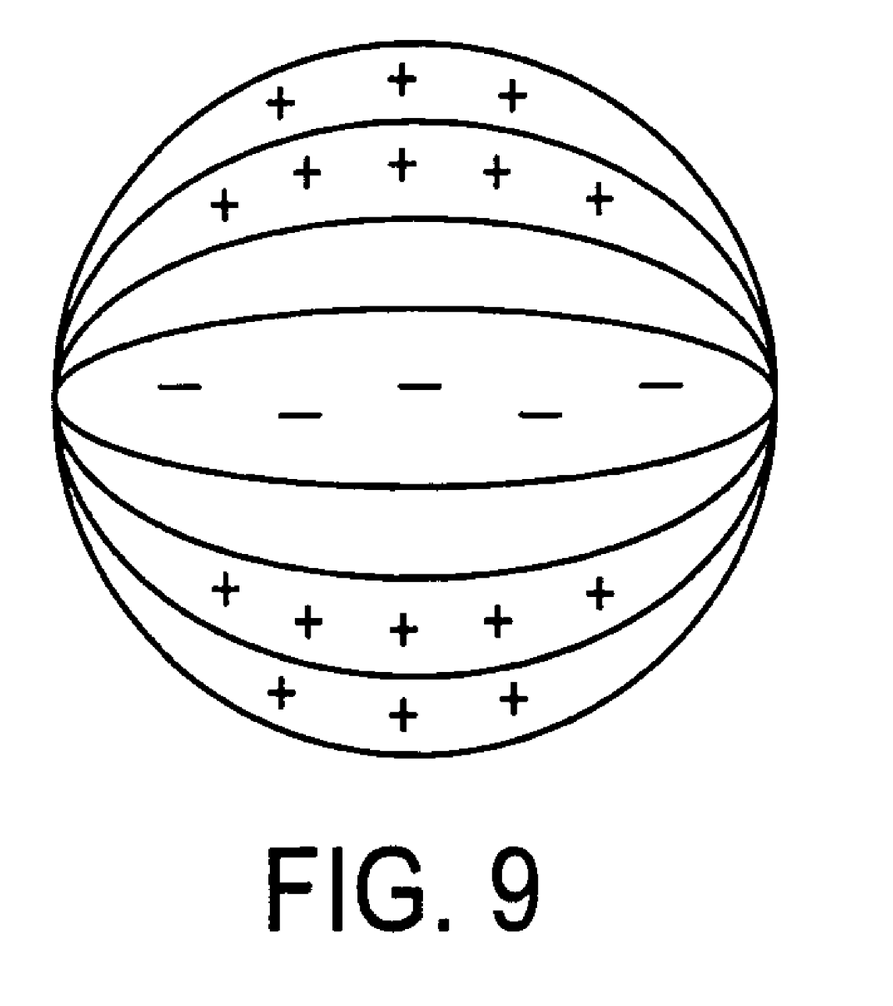
FIG. 9 is a sheet resistance map for an a non-uniformly dosed wafer.

FIG. 9 is a sheet resistance map for a non-uniformly dosed wafer. Towards the middle of the wafer, the sheet resistance is less than the average sheet resistance. This indicates that there is overdosing toward the middle of the wafer. The sheet resistance of FIG. 4 can be obtained through testing, by placing probes at different positions on the wafer.

Some implanters minimize dose non-uniformity by ignoring beam current fluctuations. This can be done, for example, by not monitoring the beam current during "beam-on-wafer" time periods. That is, a disk faraday is not used during implanting. However, if there is a problem upstream from the wafer during implanting, which cases fewer impurities to enter the wafer, then this problem cannot be recognized. Alternatively, non-uniformity can be minimized by increasing the capacity of the cryo pumps. With more powerful pumps, the resist outgassing electrons are sucked into the cryo pumps as they are released. The inventors, however, are avoiding non-uniformities with pressure compensation and the formula below.

$$I_{MEASURED}=I_{DOSE} \cdot e^{-kp}$$

$I_{MEASURED}$ is also referred as $I_{DISK}$, and is current detected by the disk faraday. $I_{DOSE}$ is the corrected dose current. The K-factor, which is input by the operator, either magnifies or diminishes the effect of pressure on the corrected dose current $I_{DOSE}$. If K is large, then an inaccuracy in $I_{MEASURED}$ produces a large inaccuracy in the compensated beam current $I_{DOSE}$. While K should be high enough to assure cross wafer dose uniformity, a small K is better in terms of dealing with noise from the pressure sensor and avoiding inaccuracies.

The conventional method to calculate the P-COMP is as follows:

1. Generate 36 wafers with patterned resist. These wafers will be used for the purpose of producing resist outgas only. Thus, there are no special requirements for these wafers other than having a patterned resist.

2. Obtain 6 test wafers. If the actual process forms an oxide with a screen oxide process, then the test wafers should be subjected to the screen oxide process.

3. Given a first guess P-COMP value, select a higher P-COMP value and a lower P-COMP value. The first guess P-COMP value may be supplied by the implanter manufacturer.

4. Implant the 6 test wafers, one at a time, with 13 wafers on a disk, under the following conditions:
   a. 12 resist dummies, 1 test wafer, low P-COMP
   b. 12 resist dummies, 1 test wafer, standard P-COMP
   c. 12 resist dummies, 1 test wafer, high P-COMP
   d. 12 bare Si dummies, 1 test wafer, low P-COMP
   e. 12 bare Si dummies, 1 test wafer, standard P-COMP
   f. 12 bare Si dummies, 1 test wafer, high P-COMP 5. Anneal the test wafers.

6. If required, strip the screen oxide from the test wafers.

7. Measure the sheet resistance $R_S$ for each of the test wafers to determine the mean sheet resistance $R_S$.

Figure 10:
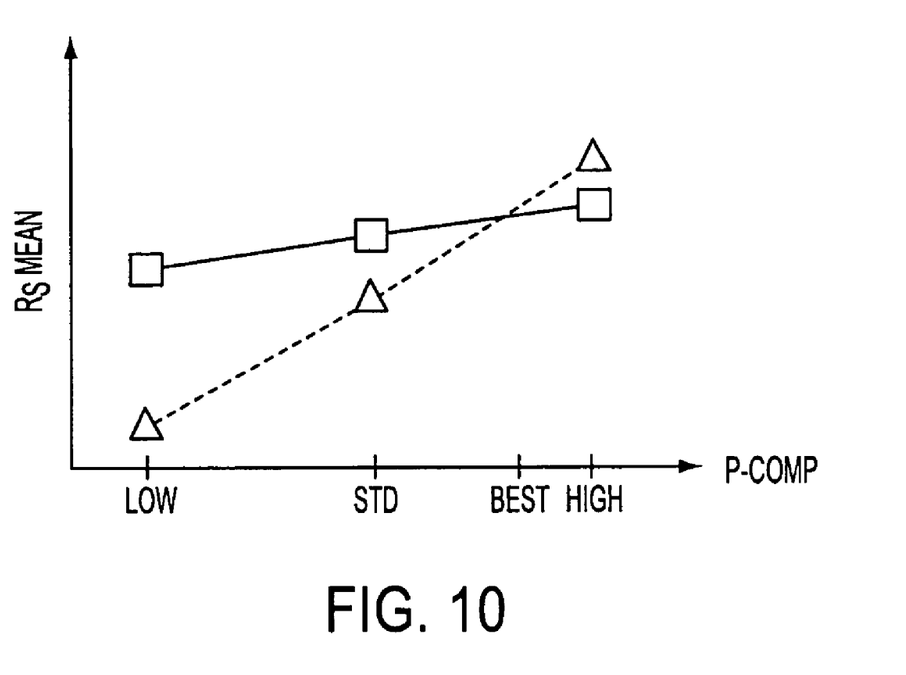
FIG. 10 is a plot of mean sheet resistance versus P_COMP values for test disk implanted with outgassing and test disks produced without outgassing.

8. Plot the mean sheet resistance $R_S$ versus the various P-COMP values as shown in FIG. 10. FIG. 10 is a plot of mean sheet resistance versus P_COMP values for test disk implanted with outgassing and test disks produced without outgassing. The P-COMP value to be used for the recipe is chosen where the line for the test wafers produced with no resist outgassing (samples d, e and f) intersects the line for the test wafers produced with resist outgassing (samples a, b and c).

The crossing lines method, while assuring dose mean matching, does not necessarily assure optimum cross-wafer dose uniformity. Only the mean sheet resistance of the entire wafer is considered. If the sheet resistance were evaluated versus wafer position (using a contour map), then it can be seen that the P-COMP values selected as optimal overdose towards the center of the wafer. Optimum uniformity cannot be achieved with the crossing lines method.

Figure 11A:
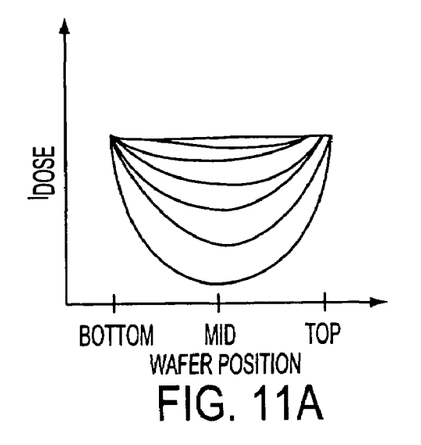
FIGS. 11A–11C are plots of the corrected dosage current $I_{DOSE}$ versus wafer position for different P-COMP values.
Figure 11B:
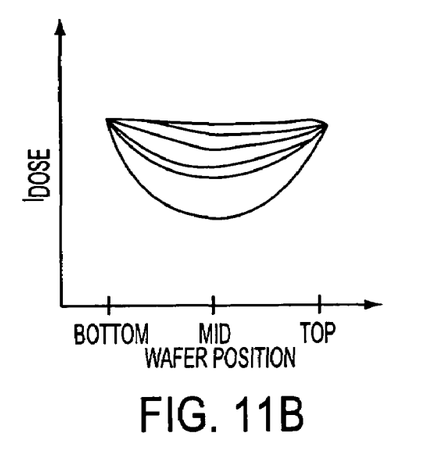
Figure 11C:
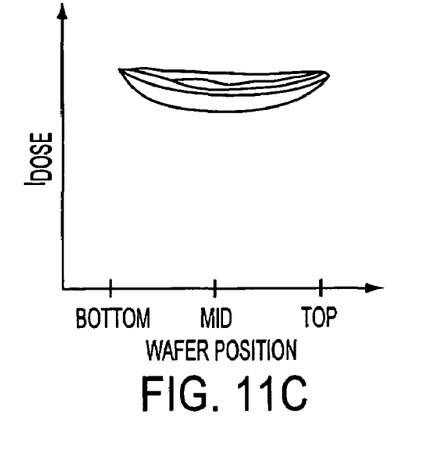

FIGS. 11A–11C are plots of the corrected dosage current $I_{DOSE}$ versus wafer position for different P-COMP values. FIGS. 11A–11C show that corrected dosage current $I_{DOSE}$ is more uniform across the wafer for higher P-COMP values. It should be noted that the dosage current $I_{DOSE}$ corresponds to the rate at which ions are implanted. If the implanter believes that ions are implanted at a slower rate, the implanter will implant ions longer. Thus, the implanter seeks to achieve an equal total dosage across the disk. Whether the total dose is actually equal depends on whether the corrected dosage current $I_{DOSE}$ is accurate.

When outgassing is the largest reason for drops in the uncorrected dosage current $I_{DOSE}$, it is safe to assume that the actual total number of dopant (ions+atoms) remains constant throughout each pass. The dose symmetry software, however, assumes that the amount of dopant is accurately described by $I_{DOSE}$. As a result, if $I_{DOSE}$ incorrectly shows a current drop in the middle of the wafer, the vertical disk speed will decrease at the middle of the wafer, thereby overdosing the middle of the disk.

While implanting wafers, the implanter software can collect beam currents, pressures, disk positions, and vertical disk speed. For example, these values may be collected as often as five times per second. After a wafer is implanted, the values are available to calculate the pressure compensation recipe according to one aspect of the invention. For example, the data could be uploaded to an Excel spreadsheet. Using this data and the equations repeated below, a compensated beam current $I_{DOSE}$ can be calculated for each point of data collection.

$$I_{DOSE} = I_{DISK} \cdot e^{-kP},$$

$$K = \ln\left(1 + \frac{P - COMP}{100}\right)(10000)$$

In these equations, the parameter K is set by the operator before the wafer is implanted. Through the compensated beam current $I_{DOSE}$, the parameter K in effect controls the vertical disk speed. The disk speed is controlled to achieve what the implanter believes to be a uniform total dose. Beam currents(dose per time) $I_{DOSE}$ and $I_{DISK}$ and pressure P are used in the above equations. The total dose and the total time that the beam spends at a particular area of the wafer are not part of the above equations. After a wafer is made, the K-factor can be changed to a K-factor different from that used to implant the wafer. The K-factor can be changed to determined how other K-factors effect the compensated beam current $I_{DOSE}$. The compensated beam current $I_{DOSE}$ altered by K-factor changes can be used to calculate a total dose based on the actual time used while fabricating the wafer. Such a calculation would produce a total dose inconsistent with what the implanter believed was the total dose for the wafer. However, this is not a concern.

If we assume that variations in the measured beam current $I_{DISK}$ are only produced from beam outgassing and neutralization, then the calculated $I_{DOSE}$ should be consistent across the wafer. To select an appropriate K-factor, the K-factor can be manipulated until a uniform $I_{DOSE}$ is achieved across the wafer. One way to manipulate the K-factor is to plot the projected beam current $I_{DOSE}$ (calculated by the manipulated K-factor) versus disk position. The K-factor can then be changed until the curve of projected beam current versus disk position flattens to substantially a straight line. The K-factor used to produce the flat curve is selected. The K-factors can be manipulated by the engineer, while the engineer watches a plot of the projected beam current versus disk position. Alternatively, the K-factors can be automatically revised to select the appropriate value.

Once the K-factor has been selected, a test wafer can be implanted using that K-factor. Then, the wafer can be tested by placing probes at various positions on the wafer, to thereby produce a sheet resistance $R_S$ contour map, such as that shown in FIG. 9. If the sheet resistance contour map shows a constant sheet resistance across the surface of the wafer, this means that there is uniform dosing across the wafer. Thus, the K-factor is correct. Using the correct K-factor, the implanter accurately calculates the compensated beam current and accurately sets the vertical disk speed to achieve a uniform total dose.

The invention has been described in detail with particular reference to preferred embodiments thereof and examples, but it will be understood that variations and modifications can be effected within the spirit and scope of the invention.

What is claimed is:

1. A process comprising:
   while implanting a first wafer, determining a rate at which ions are implanted;
   while implanting the first wafer, determining a pressure;
   using pressure changes and a pressure compensation factor to estimate a rate at which neutral atoms are implanted;
   selecting a modified pressure compensation factor that would have achieved a uniform rate of implanted ions plus implanted neutral atoms across a surface of the first wafer; and
   using the modified pressure compensation factor to implant a second wafer.

2. A process according to claim 1, wherein ions are implanted in the first wafer using a pressure compensation factor different from the modified pressure compensation factor.

3. A process according to claim 2, further comprising moving the first wafer radially with respect to an ion beam while implanting ions into the first wafer so as to achieve a uniform total dose based on the rate at which ions are implanted and the estimated rate at which neutral atoms are implanted.

4. A process according to claim 1, wherein the first and second wafers are implanted with ions in an Axcelis GSD™ platform implanter.

5. A process according to claim 1, further comprising testing the second wafer by forming a sheet resistance contour map.

6. A process according to claim 5, further comprising using the modified pressure compensation factor to implant wafers subsequent to the second wafer if the sheet resistant contour map shows uniform resistance across the wafer.

7. A process according to claim 1, wherein the following equation is used to estimate the rate at which neutral ions are implanted:

$$I_{MEASURED} = I_{DOSE} \cdot e^{-kp}$$

where $I_{MEASURED}$ is the rate at which ions are implanted, $I_{DOSE}$ is the sum of the rate at which ions are implanted and the estimated rate at which neutral atoms are implanted, K is a pressure compensation factor and P is the pressure.

8. A process according to claim 7, further comprising:
selecting a parameter P-COMP, which relates to the pressure compensation factor K according to the following equation:

$$K = \ln\left(1 + \frac{P - COMP}{100}\right)(10000).$$

9. A process comprising:
using pressure changes and a pressure compensation factor to estimate a rate at which neutral atoms are implanted;
while implanting a first wafer using a first pressure compensation factor, determining the rate at which ions are implanted;
moving the first wafer radially with respect to an ion beam while implanting ions into the first wafer so as to achieve a uniform total dose based on the rate at which ions are implanted and the estimated rate at which neutral atoms are implanted;
while implanting the first wafer, determining a pressure;
selecting a second pressure compensation factor, that would have achieved a uniform rate of implanted ions plus implanted neutral atoms across a surface of the first wafer, the second pressure compensation factor being different from the first pressure compensation factor;
using the second pressure compensation factor to implant a second wafer;
testing the second wafer by forming a sheet resistance contour map; and
using the second pressure compensation factor to implant wafers subsequent to the second wafer if the sheet resistant contour map shows uniform resistance across the wafer.

* * * * *